(12) United States Patent
Yamane (10) Patent No.: US 12,062,992 B2
(45) Date of Patent: Aug. 13, 2024

(54) POWER CONVERSION UNIT (71) Applicant: TMEIC Corporation, Chuo-ku (JP)

(72) Inventor: Keishi Yamane, Chuo-ku (JP)

(73) Assignee: TMEIC Corporation, Chuo-ku (JP)

( * ) Notice: Subject to any disclaimer, the term of this patent is extended or adjusted under 35 U.S.C. 154(b) by 147 days.

(21) Appl. No.: 17/605,128

(22) PCT Filed: Jan. 6, 2020

(86) PCT No.: PCT/JP2020/000087
§ 371 (c)(1),
(2) Date: Oct. 20, 2021

(87) PCT Pub. No.: WO2021/140547
PCT Pub. Date: Jul. 15, 2021

(65) Prior Publication Data
US 2022/0200469 A1 Jun. 23, 2022

(51) Int. Cl.
H02M 7/00 (2006.01)
H02M 7/217 (2006.01)
H05K 7/20 (2006.01)

(52) U.S. Cl.
CPC ........... H02M 7/003 (2013.01); H02M 7/217 (2013.01); H05K 7/209 (2013.01)

(58) Field of Classification Search
CPC ...... H02M 7/003; H02M 7/217; H05K 7/209; H05K 7/20927; G06F 1/20; H01L 23/36; H01L 2924/0002; B62D 5/0406
See application file for complete search history.

(56) References Cited

U.S. PATENT DOCUMENTS 7,259,356 B2 * 8/2007 Cowell ................ B23K 3/0478
219/616
8,730,672 B2 * 5/2014 Ebersberger ....... H05K 7/20927
361/689

(Continued)

FOREIGN PATENT DOCUMENTS

DE 102013109592 B3 * 10/2014 ......... H01L 23/3735
JP 64-50491 U 3/1989

(Continued)

OTHER PUBLICATIONS

Hamaya, 'Cooling Structure of Electric Device, and Motor Driven Vehicle', Nov. 8, 2007, Toyota Motor Corp, Description (Translation of JP 2007294806) (Year: 2007).*

(Continued)

Primary Examiner — Stephen S Sul
Assistant Examiner — Jeffrey F Stoll
(74) Attorney, Agent, or Firm — Oblon, McClelland, Maier & Neustadt, L.L.P.

(57) ABSTRACT

A heat sink includes a base having a flat plate shape and a heat dissipation fin. A housing accommodates the heat dissipation fin and is connected to ground. The base includes a first surface on which a semiconductor module is mounted, and a second surface opposite the first surface and to which the heat dissipation fin is fixed. The housing includes a flange supporting the second surface of the base. The power conversion unit further includes a first insulating member that electrically insulates the heat sink and the housing from each other. The first insulating member includes a base portion and a first bent portion. The base portion has a flat plate shape and is provided between the second surface of the base and the flange. The first bent portion is bent perpendicular to the base portion and is in surface contact with a side surface of the base.

8 Claims, 4 Drawing Sheets

(56) References Cited

U.S. PATENT DOCUMENTS

| | | | | |
|---|---|---|---|---|
| 10,582,607 | B2* | 3/2020 | Nakamura | H05K 1/0203 |
| 2005/0174820 | A1* | 8/2005 | Mutoh | H02M 7/003 |
| | | | | 363/144 |
| 2006/0284211 | A1* | 12/2006 | Takubo | H01L 25/072 |
| | | | | 257/E25.031 |
| 2009/0016021 | A1* | 1/2009 | Kim | H05K 7/20863 |
| | | | | 363/141 |
| 2015/0009626 | A1* | 1/2015 | Lan | H05K 7/20418 |
| | | | | 361/714 |
| 2015/0214857 | A1* | 7/2015 | Kosuga | B60L 3/04 |
| | | | | 318/400.26 |
| 2017/0079132 | A1* | 3/2017 | Bayerer | H05K 1/0231 |
| 2020/0008292 | A1* | 1/2020 | Sato | H03F 3/187 |
| 2022/0115854 | A1* | 4/2022 | Shimizu | H02G 3/16 |

FOREIGN PATENT DOCUMENTS

| | | | | |
|---|---|---|---|---|
| JP | 2007294806 | A * | 11/2007 | H01L 23/3121 |
| JP | 2010-192708 | A | 9/2010 | |
| JP | 2012156293 | A * | 8/2012 | H01L 23/3121 |
| JP | 5071405 | B2 * | 11/2012 | H01L 23/3121 |
| JP | 2014-117011 | A | 6/2014 | |
| JP | 2014216446 | A * | 11/2014 | H01L 23/46 |
| JP | 2020194872 | A * | 12/2020 | |

OTHER PUBLICATIONS

Murakami, 'Electronic Apparatus', Aug. 16, 2012, Toshiba Corp, Description (Translation of JP 2012156293) (Year: 2012).*
Sudo et al., 'Power Semiconductor Device', Nov. 14, 2012, Mitsubishi Electric Corp, Description (Translation of JP 5,071,405) (Year: 2023).*
Araki, 'Semiconductor Power Module Device', Nov. 17, 2014, Calsonic Kansei Corp, Description (Translation of JP 2014216446) (Year: 2014).*
Yanagida et al., 'Circuit Structure', Dec. 3, 2020, Autonetworks Technologies Ltd; Sumitomo Wiring Systems; Sumitomo Electric Industries, Description (Translation of JP 2020194872) (Year: 2020).*
Sagebaum et al., 'Power Semiconductor Device', Dec. 3, 2020, Semikron Elektronik GMBH, Description (Translation of DE 102013109592) (Year: 2023).*
Indian Office Action issued Aug. 11, 2022 in Indian Patent Application No. 202117047761, citing references 15 and 16 therein, 5 pages.
International Search Report issued on Mar. 24, 2020 in PCT/JP2020/000087 filed Jan. 6, 2020, 3 pages.

* cited by examiner

POWER CONVERSION UNIT

TECHNICAL FIELD

The present disclosure relates to power conversion units.

BACKGROUND ART

In a conventional configuration proposed as an attachment structure for attaching a heat sink to a frame ground, an insulating bushing having a hollow cylindrical shape is arranged between the heat sink and the frame ground, and the heat sink is fixed to the frame ground with a bolt passing through the insulating bushing (e.g., see PTL 1).

CITATION LIST

Patent Literature

PTL 1: Japanese Utility Model Laying-Open No. 64-50491

SUMMARY OF INVENTION

Technical Problem

The conventional attachment structure achieves distances (air clearance and creepage distance) for insulation between the heat sink and the frame ground by the thickness of the insulating bushing. In other words, the insulating bushing needs a thickness sufficient for achieving electrical insulation between the heat sink and the frame ground. This causes a gap corresponding to the thickness of the insulating bushing between the heat sink and the frame ground. As a result, a power conversion unit may increase in size, resulting in a larger space necessary for arranging the power conversion unit.

The present disclosure has been made in view of the above problem, and therefore has an object to allow a power conversion unit to have a more compact size while achieving electrical insulation between a heat sink and a housing.

Solution to Problem

A power conversion unit according to the present disclosure includes a semiconductor module having a semiconductor element, a heat sink, and a housing. The heat sink has a base having a flat plate shape, and a heat dissipation fin. The housing is connected to ground and accommodates the heat dissipation fin. The base has a first surface on which the semiconductor module is mounted, and a second surface which is opposite to the first surface and to which the heat dissipation fin is fixed. The housing has a flange supporting the second surface of the base. The power conversion unit further includes a first insulating member that electrically insulates the heat sink and the housing from each other. The first insulating member has a base portion and a first bent portion. The base portion has a flat plate shape and is provided between the second surface of the base and the flange. The first bent portion is bent perpendicular to the base portion and is in surface contact with a side surface of the base.

Advantageous Effects of Invention

With the present disclosure, the power conversion unit can have a more compact size while achieving electrical insulation between the heat sink and the housing.

DESCRIPTION OF EMBODIMENTS

Embodiments of the present invention will be described below in detail with reference to the drawings. The same or corresponding elements in the drawings have the same reference characters allotted, and description thereof will not be repeated in principle.

Figure 1:
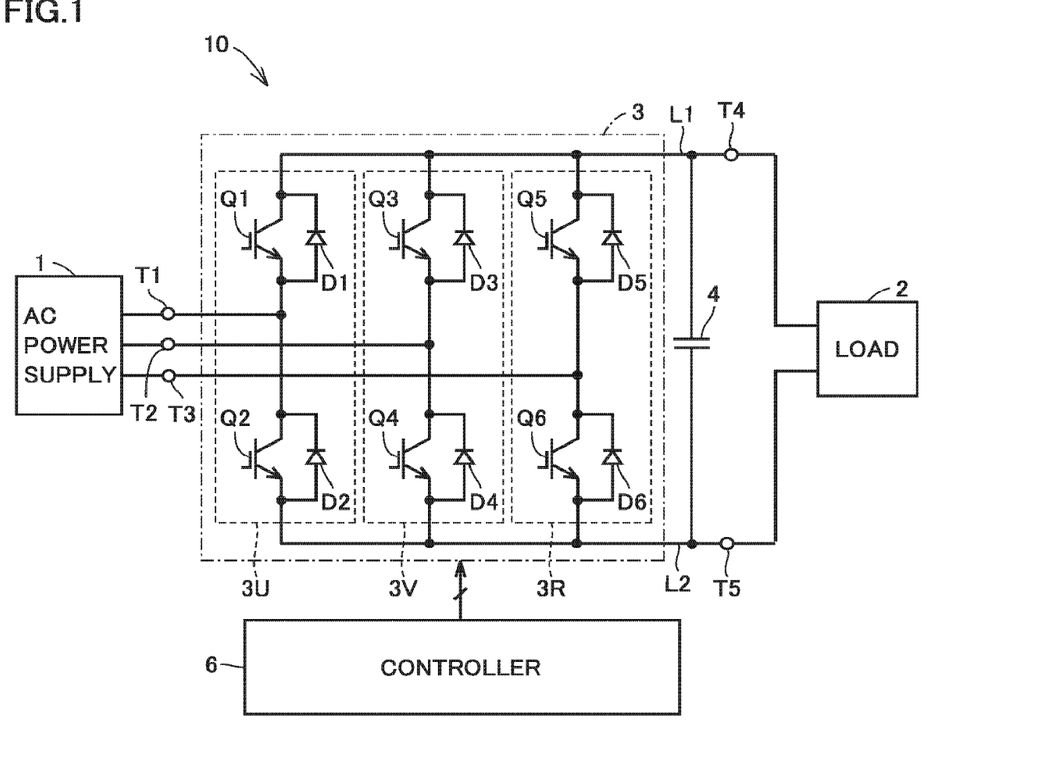
FIG. 1 is a circuit block diagram showing an example configuration of a power conversion unit according to an embodiment.

FIG. 1 is a circuit block diagram showing an example configuration of a power conversion unit according to an embodiment.

Referring to FIG. 1, a power conversion unit 10 includes alternate-current (AC) input terminals T1 to T3 and direct-current (DC) output terminals T4, T5. AC input terminals T1 to T3 receive three-phase AC power of commercial frequency from an AC power supply 1. DC output terminals T4, T5 are connected to a load 2. Load 2 is driven by DC power supplied from power conversion unit 10.

Power conversion unit 10 further includes a converter 3, a DC positive bus L1, a DC negative bus L2, a capacitor 4, and a controller 6. Converter 3 is controlled by controller 6, and converts three-phase AC power supplied from a commercial AC power supply into DC power and outputs the DC power to between DC positive bus L1 and DC negative bus L2.

Converter 3 has three leg circuits 3U, 3V, 3W. Leg circuits 3U, 3V, 3W are connected in parallel between DC positive bus L1 and DC negative bus L2. Each of leg circuits 3U, 3V, 3W has two switching elements connected in series and two diodes.

Specifically, leg circuit 3U has a switching element Q1 connected between DC positive bus L1 and AC input terminal T1, a switching element Q2 connected between AC input terminal T1 and DC negative bus L2, and diodes D1, D2. Switching elements Q1, Q2 can be any self-turn-off switching elements such as insulated gate bipolar transistors (IGBTs) or gate commutated turn-off (GCT) thyristors. Diodes D1, D2 are freewheeling diodes (FWDs) and are connected in anti-parallel with switching elements Q1, Q2, respectively. The switching element and diode correspond to an embodiment of the "semiconductor element".

Leg circuit 3V has a switching element Q3 connected between DC positive bus L1 and AC input terminal T2, a switching element Q4 connected between AC input terminal T2 and DC negative bus L2, and diodes D3, D4. Leg circuit 3W has a switching element Q5 connected between DC positive bus L1 and AC input terminal T3, a switching element Q6 connected between AC input terminal T3 and DC negative bus L2, and diodes D5, D6. Hereinbelow, when switching elements Q1 to Q6 and diodes D1 to D6 are collectively described, they are referred to as switching element Q and diode D, respectively.

Controller 6 operates in synchronization with AC voltages of AC input terminals T1 to T3, and controls converter 3 such that a DC voltage VDC between DC output terminals T4, T5 attains to a target DC voltage VDCT. Specifically, controller 6 controls six switching elements Q1 to Q6 to convert DC voltage VDC between DC output terminals T4, T5 into a three-phase AC voltage and output the three-phase AC voltage to between AC input terminals T1 to T3. At this time, controller 6 can control six switching elements Q1 to Q6 such that AC currents flowing through AC input terminals T1 to T3 are in substantially sinusoidal shape and are in phase with the AC voltages of AC input terminals T1 to T3, thereby achieving a power factor of nearly one.

Each of three leg circuits 3U, 3V, 3W constituting converter 3 is formed of a semiconductor module. An example configuration of the semiconductor module will now be described in detail.

Figure 2:
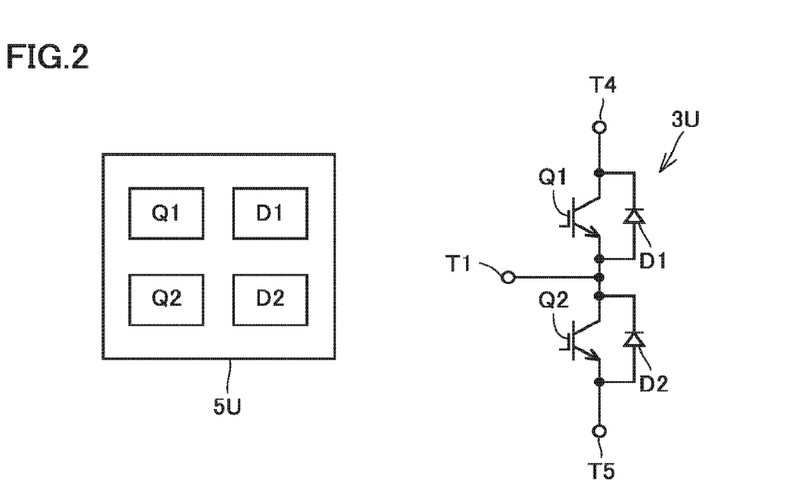
FIG. 2 is a schematic plan view of an example configuration of a semiconductor module.

FIG. 2 is a schematic plan view of an example configuration of the semiconductor module.

In the example of FIG. 1, three semiconductor modules 5U, 5V, 5W are arranged corresponding to three leg circuits 3U, 3V, 3W. Since the semiconductor modules of the respective phases have the same configuration, FIG. 2 describes the configuration of semiconductor module 5U of U phase.

Semiconductor module 5U has a configuration in which switching elements Q1, Q2 and diodes D1, D2 are mounted on a substrate having a flat plate shape. Switching elements Q1, Q2 and diodes D1, D2 are electrically connected by a bonding wire (not shown) or a wiring layer (not shown) formed of a conductor. Switching elements Q1, Q2 and diodes D1, D2 are sealed with a resin together with the substrate, the bonding wire, the wiring layer, and the like.

Although FIG. 2 shows an example configuration in which two switching elements and two diodes are provided for one semiconductor module 5U, four switching elements and four diodes may be provided. In such a configuration, two switching elements are connected in parallel, and two diodes are connected in parallel.

Figure 3:
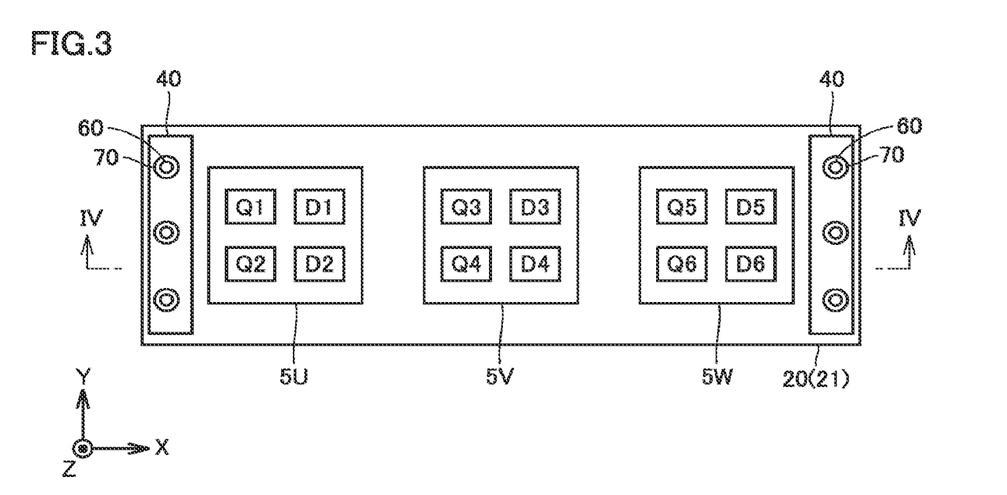
FIG. 3 is a schematic plan view of an arrangement of elements of three semiconductor modules.
Figure 4:
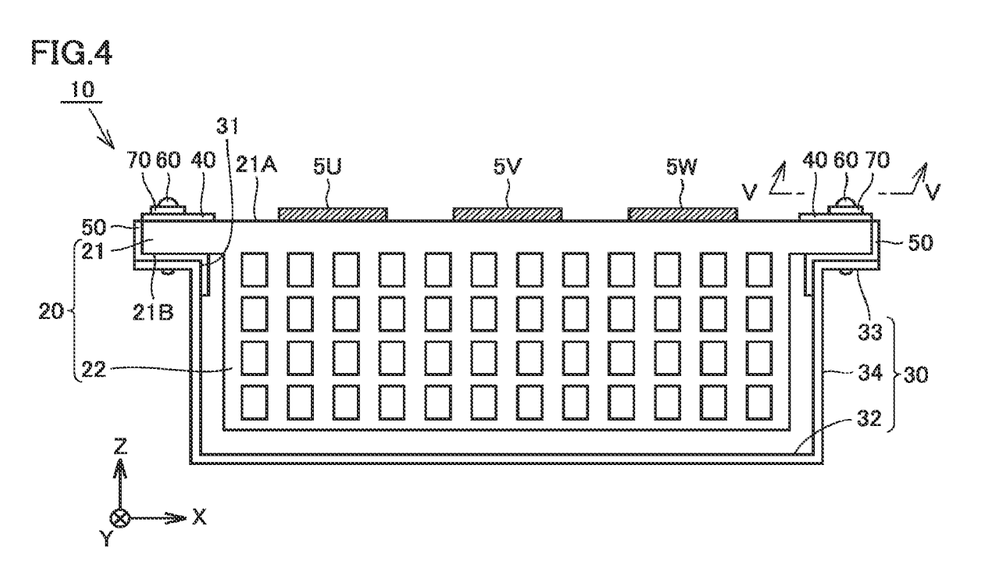
FIG. 4 is a sectional view taken along the line IV-IV in FIG. 3.

FIG. 3 is a schematic plan view of an arrangement of elements of three semiconductor modules 5U, 5V, 5W. FIG. 4 is a sectional view taken along the line IV-IV in FIG. 3.

Power conversion unit 10 further includes a heat sink 20 and a housing 30. Heat sink 20 has a base 21 and a heat dissipation fin 22. Base 21 and heat dissipation fin 22 are made of, for example, a highly conductive metal such as aluminum or copper. Base 21 is formed in a flat plate shape and has a rectangular plate shape. Base 21 has a first surface 21A and a second surface 21B opposite to first surface 21A. Semiconductor modules 5U, 5V, 5W are mounted side by side on first surface 21A of base 21. Heat dissipation fin 22 is fixed to second surface 21B of base 21.

In each of semiconductor modules 5U, 5V, 5W, a power loss occurs due to a conduction loss and a switching loss in switching element Q and diode D during operation, and accordingly, switching element Q and diode D generate heat. The heat generated in each of semiconductor modules 5U, 5V, 5W is conducted from each semiconductor module via base 21 to heat dissipation fin 22, and is then dissipated from heat dissipation fin 22 to outside.

As shown in FIG. 4, heat sink 20 is accommodated in housing 30. Housing 30 has an approximately rectangular parallelepiped shape, and an opening 31 is formed above semiconductor modules 5U, 5V, 5W. Housing 30 is formed of, for example, a metal such as iron or stainless steel. Housing 30 is connected to ground (ground potential).

Housing 30 has a bottom 32, a flange 33, and a sidewall 34 connecting bottom 32 and flange 33. Flange 33 is formed annularly along an opening edge of opening 31. Flange 33 is configured to support an outer circumferential edge of second surface 21B of base 21. Base 21 is fastened to flange 33 with a bolt 60 to be fixed to housing 30.

Since heat sink 20 has conductivity, electrical insulation is necessary between heat sink 20 and housing 30. If electrical insulation is not provided between heat sink 20 and housing 30, a current may flow due to a potential difference occurring between DC negative bus L2 (see FIG. 1) of semiconductor modules 5U, 5V, 5W and ground (ground potential) to cause a power loss. Also, electromagnetic noise caused during operation of semiconductor modules 5U, 5V, 5W may leak out of housing 30 through heat sink 20 and housing 30.

In a conventional configuration proposed as an attachment structure for attaching a heat sink to a frame ground, an insulating bushing having a hollow cylindrical shape is arranged between the heat sink and the frame ground, and the heat sink is fixed to the frame ground with a bolt passing through the insulating bushing (e.g., see PTL 1). In the above configuration, the insulating bushing has a larger diameter than the through hole formed in the heat sink and has a flange having a prescribed thickness. The insulating bushing is inserted through the through hole from a first surface of the heat sink, and on a portion at the through hole in a second surface of the heat sink, an insulating member is layered that has a diameter larger than that of the through hole and has a sufficiently thick wall in terms of strength. Then, the frame ground is fixed to the heat sink with the flange of the insulating bushing therebetween with a bolt passing through the insulating bushing from the insulating member.

The conventional attachment structure described above achieves distances (air clearance and creepage distance) for insulation between the heat sink and the frame ground by the thickness of the flange of the insulating bushing. Note that values required for the air clearance and creepage distance are determined based on, for example, an operating voltage of a power conversion unit. In other words, the flange of the insulating bushing needs a thickness enough to achieve electrical insulation between the heat sink and the frame ground. This causes a gap corresponding to the thickness of the flange of the insulating bushing between the heat sink and the frame ground. As a result, a power conversion unit may increase in size, resulting in a larger space necessary for arranging the power conversion unit.

The present embodiment thus proposes an attachment structure for heat sink 20 which allows power conversion unit 10 to have a more compact size while achieving electrical insulation between heat sink 20 and housing 30.

Figure 5:
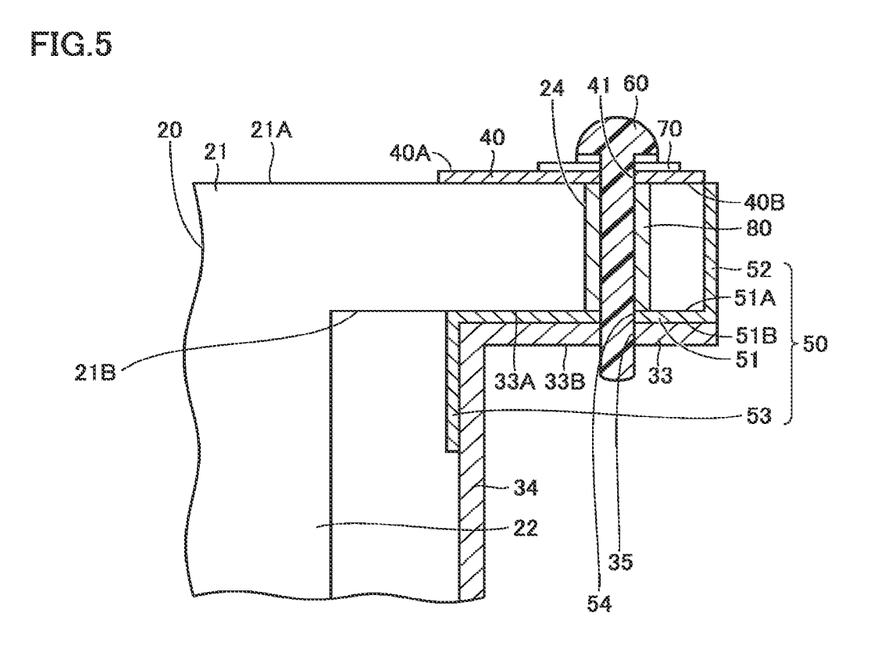
FIG. 5 is a sectional view taken along the line V-V in FIG. 4.
Figure 6:
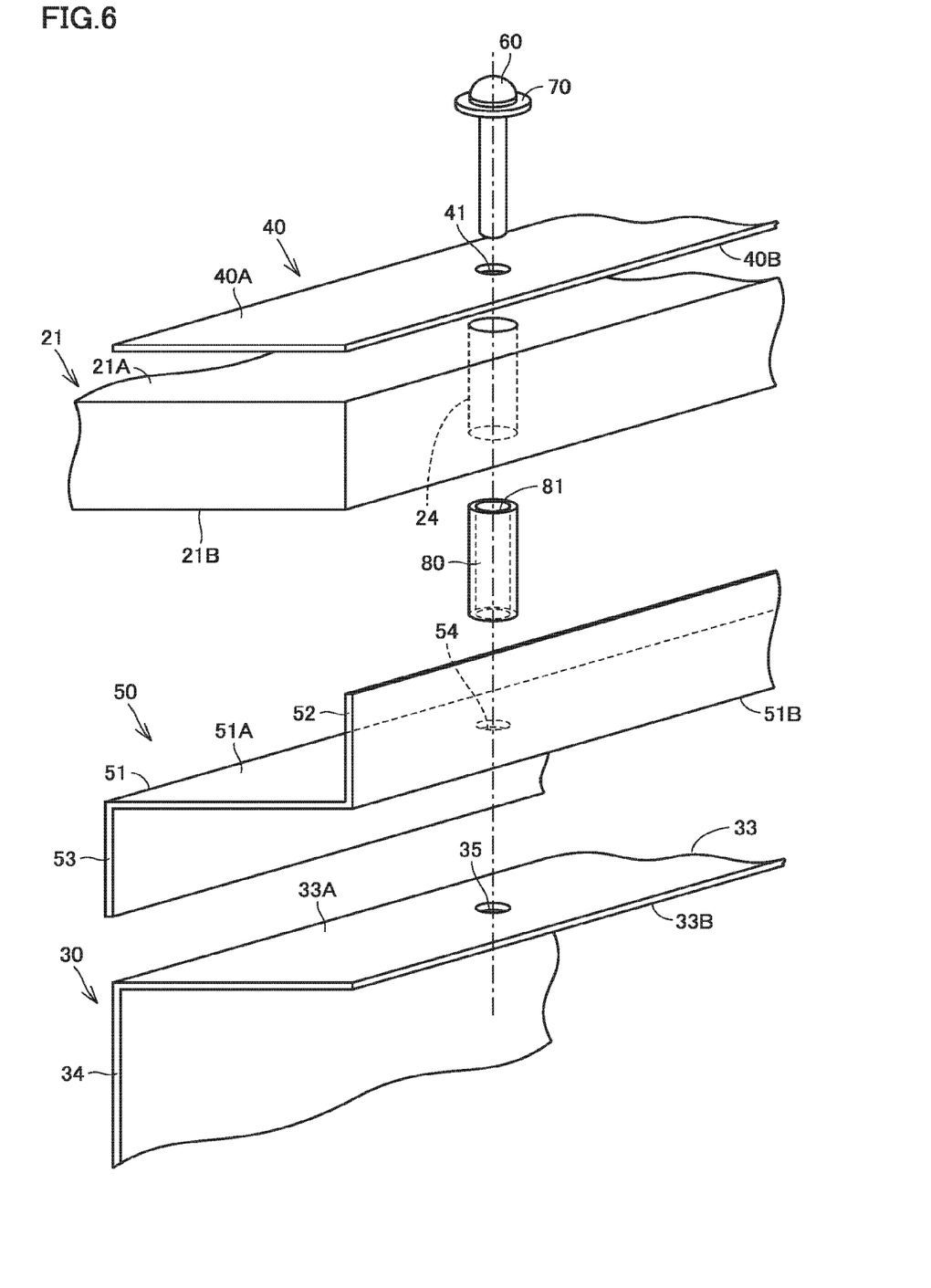
FIG. 6 is a perspective developed view schematically showing an attachment structure for a heat sink.

FIG. 5 is a sectional view taken along the line V-V in FIG. 4. FIG. 6 is a perspective developed view schematically showing an attachment structure for heat sink 20.

Referring to FIG. 5, power conversion unit 10 further includes insulating members 40, 50, bolt 60, a washer 70, and an insulating spacer 80.

Insulating member 40 is formed in a flat plate shape and has a rectangular plate shape. Insulating member 40 is formed of an insulating material, for example, a resin such as polycarbonate, polyimide, polypropylene, polyethylene, polyvinyl chloride, or ABS resin. The thickness of insulating member 40 is not less than 0.5 mm and not greater than 2.0 mm, and is approximately 0.5 mm. Insulating member 40 has a first surface 40A and a second surface 40B opposite to first surface 40A. Insulating member 40 has a plurality of through holes 41 passing through insulating member 40 in the thickness direction. Through holes 41 are arranged side by side along a long side of insulating member 40 having a rectangular plate shape. Insulating member 40 corresponds to one embodiment of the "second insulating member".

Insulating member 50 has a base portion 51 and bent portions 52, 53 bent perpendicular to base portion 51. Insulating member 50 is formed of an insulating material, for example, a resin such as polycarbonate, polyimide, polypropylene, polyethylene, polyvinyl chloride, or ABS resin. The thickness of insulating member 50 is not less than 0.5 mm and not greater than 2.0 mm and is, for example, approximately 0.5 mm. Insulating member 50 corresponds to one embodiment of the "first insulating member".

Base portion 51 is formed in a flat plate shape and has an approximately rectangular plate shape. Base portion 51 has a first surface 51A and a second surface 51B opposite to first surface 51A. Base portion 51 has a plurality of through holes 54 passing through base portion 51 in the thickness direction. Through holes 54 are arranged side by side along a long side of base portion 51 having a rectangular plate shape.

First bent portion 52 has a flat plate shape. First bent portion 52 is bonded to a first side of the long side of base portion 51 having a rectangular plate shape and projects perpendicular to first surface 51A of base portion 51.

Second bent portion 53 has a flat plate shape. Second bent portion 53 is bonded to a second side of the long side of base portion 51 having a rectangular plate shape and projects perpendicular to second surface 51B of base portion 51. Second bent portion 53 is provided in parallel with first bent portion 52. Insulating member 50 is formed by drilling a raw material having a flat plate shape and then bending the raw material.

Insulating spacer 80 has a hollow cylindrical shape. Insulating spacer 80 is formed of an insulating material, for example, a resin such as polycarbonate, polyimide, polypropylene, polyethylene, polyvinyl chloride, or ABS resin. Insulating spacer 80 has a length in the direction of extension which is equal to the thickness of base 21. Being equal to the thickness of base 21 includes a range in which a difference in the length from the thickness of base 21 is not greater than 5%. Note that the length of insulating spacer 80 is not larger than the thickness of base 21. The inside diameter of insulating spacer 80 having a hollow cylindrical shape is larger than the diameter of the shank of bolt 60. The outside diameter of insulating spacer 80 is smaller than the inside diameter of through hole 24 formed in base 21.

Flange 33 of housing 30 is formed in a flat plate shape and has a rectangular plate shape. Flange 33 has a first surface 33A and a second surface 33B opposite to first surface 33A. The thickness of flange 33 is, for example, approximately 1.6 mm. Flange 33 has a plurality of through holes 35 passing through flange 33 in the thickness direction.

The outer circumferential edge of base 21 having a rectangular plate shape has a plurality of through holes 24 passing through base 21 in the thickness direction. Through holes 24 are arranged side by side along one long side of base 21 having a rectangular plate shape.

Power conversion unit 10 according to the present embodiment is formed by fixing base 21 of heat sink 20 to flange 33 of housing 30. With base 21 appropriately assembled to flange 33, through hole 24 formed in base 21 and through hole 35 formed in flange 33 overlap and are arranged concentrically with each other. Through hole 24 and through hole 35 are typically formed in the same shape.

Base 21 is fastened to flange 33 with bolt 60 passing through through holes 24, 35. Base 21 is thus fixed to flange 33. Annular washer 70 is arranged between the head of bolt 60 which is located at its end and first surface 21A of base 21.

Insulating spacer 80 having a hollow cylindrical shape is arranged inside through hole 24 such that the outer circumferential surface thereof is in surface contact with an inner circumferential surface of through hole 24 of base 21. Bolt 60 is arranged in a hollow portion 81 of insulating spacer 80 so as to pass through hollow portion 81 of insulating spacer 80.

Insulating member 40 having a flat plate shape is provided between washer 70 and base 21. Insulating member 40 is arranged such that first surface 40A is in surface contact with washer 70 and second surface 40B is in surface contact with first surface 21A of base 21.

Insulating member 50 is provided between second surface 21B of base 21 and flange 33. Insulating member 50 is arranged such that first surface 51A of base portion 51 having a flat plate shape is in surface contact with second surface 21B of base 21 and second surface 51B of base portion 51 is in surface contact with first surface 33A of flange 33. At this time, first bent portion 52 having a flat plate shape is in surface contact with a side surface of base 21 having a rectangular plate shape. Second bent portion 53 having a flat plate shape is in surface contact with sidewall 34 of housing 30.

With insulating members 40, 50 appropriately arranged relative to base 21 and flange 33, through hole 41 formed in insulating member 40 and through hole 54 formed in base portion 51 of insulating member 50 overlap and are arranged concentrically with through hole 24 formed in base 21 and through hole 35 formed in flange 33.

Power conversion unit 10 described above achieves electrical insulation between heat sink 20 and housing 30 by insulating member 50. Specifically, base portion 51 of insulating member 50 (first insulating member) is arranged between base 21 of heat sink 20 and flange 33 of housing 30. Since base portion 51 is formed in a flat plate shape, a gap between base 21 and flange 33 can be reduced by reducing the thickness of the flat plate. Thus, the height of power conversion unit 10 in the vertical direction (corresponding to the direction normal to base 21) can be small compared with a conventional insulating bushing, and accordingly, power conversion unit 10 can have a more compact size.

Base 21 and flange 33 come closer to each other with a smaller thickness of base portion 51, making it difficult to achieve electrical insulation between heat sink 20 and housing 30. Insulating member 50 thus has bent portions 52, 53 bent perpendicular to base portion 51. First bent portion 52 functions to increase insulation distances (air clearance and creepage distance) between base 21 and flange 33. Second bent portion 53 functions to increase the creepage distance between second surface 21B of base 21 and sidewall 34.

The width (the length in the vertical direction of power conversion unit 10) of first bent portion 52 can be set in accordance with values required for the insulation distances between base 21 and flange 33. The width of first bent portion 52 and the thickness of base 21 are thus equal to each other in the example of FIG. 5, and alternatively, the width of first bent portion 52 may be smaller than the thickness of base 21. The width (the length in the vertical direction of power conversion unit 10) of second bent portion 53 can be set in accordance with values required for the insulation distances between heat dissipation fin 22 and sidewall 34.

Bent portions 52, 53 are bonded to base portion 51 as described above, and accordingly, the insulation distances between heat sink 20 and housing 30 can be large compared with the case where insulating member 50 is formed of base portion 51 alone. As a result, the electrical insulation between heat sink 20 and housing 30 can be achieved even when the thickness of base portion 51 is reduced to bring base 21 and flange 33 close to each other.

Also, in power conversion unit 10 according to the present embodiment, electrical insulation between heat sink 20 and bolt 60 is achieved by insulating member 40 and insulating spacer 80. Since insulating member 40 is formed in a flat plate shape, the gap between the head of bolt 60 and first surface 21A of base 21 can be reduced by reducing the thickness of the flat plate. This can reduce the height of power conversion unit 10 in the vertical direction, leading to a more compact size of power conversion unit 10. Also, the insulation distances between base 21 and bolt 60 can be achieved by insulating member 40 and insulating spacer 80 even when the thickness of insulating member 40 is reduced.

In power conversion unit 10 according to the present embodiment, insulating member 50 is formed in a crank shape including base portion 51 and bent portions 52, 53, and accordingly, insulating member 50 can be easily positioned relative to base 21 in the step of assembling power conversion unit 10. This simplifies the step of assembling power conversion unit 10.

Although the above embodiment has described the configuration in which insulating member 50 has base portion 51 and two bent portions 52, 53, when there is a sufficient distance for insulation between heat dissipation fin 22 of heat sink 20 and sidewall 34 of housing 30, second bent portion 53 can be omitted from insulating member 50. In this case, insulating member 50 has base portion 51 and first bent portion 52.

Although the above embodiment has described the configuration in which insulating member 40 and insulating member 50 are formed separately, insulating member 40 and insulating member 50 may be formed integrally. In this case, insulating member 40 is bonded to a first side of a long side of first bent portion 52 having a rectangular plate shape and projects perpendicular to first bent portion 52. Insulating member 40 and base portion 51 are arranged in parallel with each other.

It should be construed that the embodiments disclosed herein are given by way of illustration in all respects, not by way of limitation. It is therefore intended that the scope of the present invention is defined by claims, not only by the embodiments described above, and encompasses all modifications and variations equivalent in meaning and scope to the claims.

REFERENCE SIGNS LIST

1 AC power supply; 2 load; 3 converter; 3U, 3V, 3W leg circuit; 4 capacitor; 5U, 5V, 5W semiconductor module; 10 power conversion unit; 20 heat sink; 21 base; 22 heat dissipation fin; 30 housing; 31 opening; 32 bottom; 33 flange; 34 sidewall; 40, 50 insulating member; 51 base portion; 52 first bent portion; 53 second bent portion; 60 bolt; 70 washer; 80 insulating spacer.

The invention claimed is:

1. A power conversion unit comprising:
a semiconductor module including a semiconductor element;
a heat sink including
a base having a flat plate shape, and
a heat dissipation fin;
a housing connected to ground, the housing accommodating the heat dissipation fin; and
the base including a first surface on which the semiconductor module is mounted, and a second surface which is opposite to the first surface and to which the heat dissipation fin is fixed,
the housing including a flange supporting the second surface of the base,
a first insulating member that electrically insulates the heat sink and the housing from each other, the first insulating member including
a base portion having a flat plate shape and provided between the second surface of the base and the flange, and
a first bent portion which is bent perpendicular to the base portion and is in surface contact with a side surface of the base,
wherein the first bent portion is in contact with a second insulating member to enclose an edge region of the base.

2. The power conversion unit according to claim 1, wherein the first insulating member further includes a second bent portion which is bent perpendicular to the base portion and is in surface contact with a sidewall of the housing.

3. The power conversion unit according to claim 2, wherein
the base has a first through hole passing through the base in a thickness direction,
each of the flange and the first insulating member has a second through hole overlapping the first through hole,
the power conversion unit further comprises:
a bolt passing through the first through hole and the second through holes of the first insulating member and the flange for fastening the base to the flange; and
the second insulating member and an insulating spacer that electrically insulates the heat sink and the bolt from each other,
the second insulating member has a flat plate shape and is provided between a head of the bolt and the first surface of the base, and
the insulating spacer is arranged inside the first through hole of the base so as to allow the bolt to pass therethrough.

4. The power conversion unit according to claim 3, wherein the second insulating member has a thickness of not less than 0.5 mm and not greater than 2.0 mm.

5. The power conversion unit according to claim 2, wherein the base portion of the first insulating member has a thickness of not less than 0.5 mm and not greater than 2.0 mm.

6. The power conversion unit according to claim 1, wherein
the base has a first through hole passing through the base in a thickness direction,
each of the flange and the first insulating member has a second through hole overlapping the first through hole,
the power conversion unit further comprises:
a bolt passing through the first through hole and the second through holes of the first insulating member and the flange for fastening the base to the flange; and
the second insulating member and an insulating spacer that electrically insulates the heat sink and the bolt from each other,
the second insulating member has a flat plate shape and is provided between a head of the bolt and the first surface of the base, and the insulating spacer is arranged inside the first through hole of the base so as to allow the bolt to pass therethrough.

7. The power conversion unit according to claim 6, wherein the second insulating member has a thickness of not less than 0.5 mm and not greater than 2.0 mm.

8. The power conversion unit according to claim 1, wherein the base portion of the first insulating member has a thickness of not less than 0.5 mm and not greater than 2.0 mm.

* * * * *